United States Patent [19]

Lapham et al.

[11] Patent Number: 4,963,342
[45] Date of Patent: Oct. 16, 1990

[54] SOLUTIONS OF PERMONOSULPHURIC ACID

[75] Inventors: David J. Lapham, Derbyshire; Nicholas A. Troughton, Cheshire, both of United Kingdom

[73] Assignee: Micro-Image Technology Limited, London, England

[21] Appl. No.: 361,143

[22] Filed: Jun. 5, 1989

[30] Foreign Application Priority Data

Jun. 11, 1988 [GB] United Kingdom ............... 8813889

[51] Int. Cl.$^5$ .................. C01B 15/06; C23G 1/02; C09K 13/04; C11D 7/18
[52] U.S. Cl. ................................ 423/513; 134/3; 134/41; 156/659.1; 156/901; 156/904; 252/79.2; 252/79.4; 252/186.27; 423/273
[58] Field of Search ............. 423/513, 521, 272, 273, 423/275; 156/901, 904, 659.1; 252/79.2, 79.7, 186.27; 134/3, 41

[56] References Cited

U.S. PATENT DOCUMENTS

| | | | |
|---|---|---|---|
| 3,043,658 | 7/1962 | Banfield | 423/272 |
| 3,053,633 | 9/1962 | Dunlop et al. | 423/272 |
| 3,333,925 | 8/1967 | Young | 423/272 |
| 3,383,174 | 5/1968 | Carnine et al. | 423/273 |
| 3,387,939 | 6/1968 | Reilly et al. | 423/273 |
| 4,051,058 | 9/1977 | Bowing et al. | 423/272 |
| 4,362,706 | 12/1982 | Willard | 423/273 |
| 4,395,302 | 7/1983 | Courduvelis | 252/79.2 |
| 4,401,509 | 8/1983 | Schellinger, Jr. | 252/79.4 |
| 4,534,945 | 8/1985 | Hopkins | 423/272 |
| 4,885,106 | 12/1989 | Lapham et al. | 252/100 |
| 4,917,122 | 4/1990 | Lapham | 156/651 |

FOREIGN PATENT DOCUMENTS

| | | | |
|---|---|---|---|
| 256284 | 2/1988 | European Pat. Off. | 423/513 |
| 2343797 | 11/1976 | France | 423/272 |

*Primary Examiner*—Gary P. Straub
*Attorney, Agent, or Firm*—Kane, Daisimer, Sullivan, Kurucz, Levy, Eisele and Richard

[57] ABSTRACT

Aqueous mixed permonosulphuric acid/sulphuric acid solutions, such as semiconductor surface photoresist stripping solutions may be stabilised for storage by the addition of one or more of the metals gallium, germanium, indium, tin in the 4-valent form, antimony, thallium, bismuth and lead suitably in the oxide or hydrous oxide form. Mixtures of metals, for example of bismuth, tin in the 4-valent form, gallium and germanium may be particularly effective.

12 Claims, 2 Drawing Sheets

SOLUTIONS OF PERMONOSULPHURIC ACID

BACKGROUND OF THE INVENTION

1. Field of the Invention

This invention relates to the stabilisation of solutions of permonosulphuric acid.

2. Brief Description of the Prior Art

Solutions of permonosulphuric acid may be produced by reacting sulphuric acid and hydrogen peroxide in the presence of water. In order to prevent undue decomposition of the hydrogen peroxide and a reduction in the available oxygen content of the solution the reaction mixture is preferably formed by introducing an aqueous solution of hydrogen peroxide into a quantity of concentrated sulphuric acid while controlling the temperature, if necessary by cooling, to avoid the evolution of nascent oxygen, at a temperature preferably below 20° C. particularly preferably below 15° C.

Hydrogen peroxide is not normally commercially available at concentrations substantially above about 85% by weight in water, so-called "high test" hydrogen peroxide. While high test hydrogen peroxide may very suitably be utilised to form the reaction mixture this is not essential. Preferably the hydrogen peroxide, as introduced, has a concentration of at least 50%, and particularly preferably of at least 60% by weight.

The concentration of sulphuric acid in the solution is an important feature in that, if the said concentration is below about 60% by weight only a low concentration of permonosulphuric acid can be achieved or maintained. The presence of higher concentrations of sulphuric acid in the stripping solutions enables higher concentrations of permonosulphuric acid to be achieved. In a test an aqueous solution made up by the addition of 85% hydrogen peroxide to 75 % weight of $H_2SO_4$ contained 1.43% weight of hydrogen peroxide and 4.22% wt of permonosulphuric acid. Further solutions were produced using the same recipe each modified only in that the initial concentration of the sulphuric acid was increased to 80%, 85%, 90% and 95% by weight. The % by weight of permonosulphuric acid and residual hydrogen peroxide in each of these solutions was determined experimentally and is set out in the following Table 1.

TABLE 1

| % wt $H_2SO_4$ | % wt $H_2SO_5$ | % wt Residual $H_2O_2$ |
| --- | --- | --- |
| 75 | 4.22 | 1.43 |
| 80 | 5.46 | 0.89 |
| 85 | 6.88 | 0.31 |
| 90 | 6.66 | 0.21 |
| 95 | 6.75 | 0.10 |

Suitably the concentration of sulphuric acid in the stripping solutions is greater than 60% by weight, preferably greater than 75% by weight and particularly preferably greater than 85% by weight and the concentrations and ratios of the ingredients are controlled accordingly.

The quantity of hydrogen peroxide relative to that of sulphuric acid may suitably be such as to produce from 0.2% to 10%, particularly preferably from 2% to 10% by weight of permonosulphuric acid according to the equation

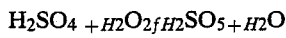

$$H_2SO_4 + H_2O_2 \rightleftharpoons H_2SO_5 + H_2O$$

Solutions of permonosulphuric acid are of use in industry, for example as photoresist stripping solutions for use in the course of the production of integrated circuitry based on semi-conductor wafers in the electronics industry. There have been proposals, for example in Japanese Patent Publication No. 50-101107 and to produce such stripping solutions at the point of use. U.S. Pat. Specification No. 3900337 discloses the production of photoresist stripping solutions based on a mixture of sulphuric acid and hydrogen peroxide which have a storage life of 3 weeks at ambient temperature.

It would be advantageous to produce solutions of permonosulphuric acid having an extended storage life.

There have been proposals to produce long term storagestable solutions of permonosulphuric acid notably in European Patent Publication 0256284. To attain this objective that Publication teaches the observance of a procedure for the formation of the reaction mixture for the production of such solutions, the use of electronic grade reagents, the inclusion of a sequestrant and the inclusion of a stabilising quantity of a soluble tin compound, very suitably a stannate such as an alkali metal stannate or stannous oxide, or any other tin compound which forms a hydrous tin oxide in the reaction mixture.

SUMMARY OF THE INVENTION

It has been found according to the present invention that tin in the 4-valent i.e. stannic form and alternatively or additionally other metals adjacent to tin in the Periodic Table are more effective in achieving the stabilisation of solutions of permonosulphuric acid than sodium stannate or stannous oxide. The Periodic Table referred to is that published in the Handbook of Chemistry and Physics, 59th Edition Published by the CRC Press.

DETAILED DESCRIPTION OF THE PREFERRED EMBODIMENTS OF THE INVENTION

Figure 1:
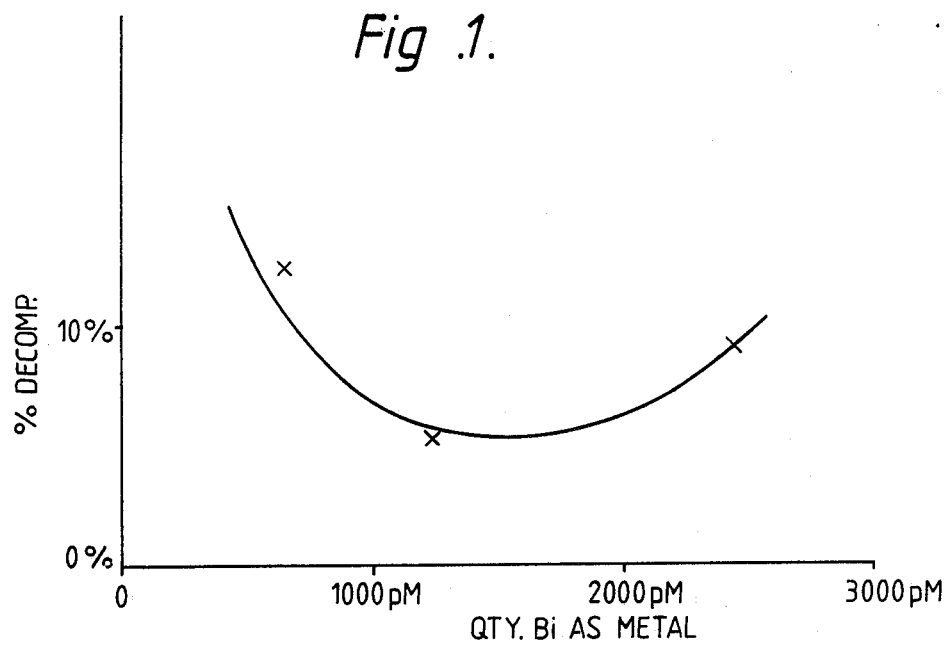
FIG. 1 is a graph showing decomposition of permonosulfuric acid stabilized with varying quantities of bismuth (Example 1) added as $Bi_2O_3$.

The present invention therefore provides a stabilised aqueous mixed permonosulphuric acid, sulphuric acid solution also containing a sequestrant and a stabilising quantity of an added metal compound, the solution being suitable for use to strip photoresist residues from semiconductor surfaces and being characterised in that the added metal compound is selected from one or more of gallium, germanium, indium, tin in the 4-valent form, antimony, thallium, bismuth and lead.

Arsenic is omitted because it is well known to have a deleterious effect on permonosulphuric acid and would be expected to cause a reduction in the quantity of available oxygen in the solution.

It has been found that there is an optimum quantity of added metal above and below which decreased stabilisation is achieved. This quantity is readily determinable where only a single added metal is used. Where combinations of metals are used there is interference and it is not possible to define simply the optimum level for each metal in the mixture. However, bearing in mind that too great a quantity of each, as well as too little, may cause a reduction in the stabilising effect, it is possible, by testing, to modify any starting mixtures of different metals, each in a very small but controlled quantity, to produce a formulation which can give better stabilisation than the same total quantity of a single metal, or equivalent stabilisation using a smaller total quantity. Mixtures containing 4-valent tin, gallium or germanium, for example can give better stabilisation than the individual metals and mixtures containing bismuth are effective in a smaller quantity than bismuth alone.

Such combinations of different metals may very suitably include tin, preferably in the 4-valent form or both tin, preferably in the 4-valent form, and bismuth. However other combinations of the the stated metals may prove equally effective.

Where tin is used alone it is present in the solution to be stabilised preferably in not more than a 420 picomolal quantity (i.e. 420 picomoles/kg hereafter denoted by pM) particularly preferably in from 50 to 300 pM. Where it is used in combination with other metals it is preferably present in from 50 to 250 pM.

Where bismuth is used alone it is present in the solution to be stabilised preferably in not more than 2500 pM particularly preferably in from 500 to 2000 pM. Where it is used in combination with other metals it is preferably present in a from 50 to 250 pM.

Where germanium is used it is present in the solution to be stabilised preferably in not more than a 1000 pM quantity, particularly preferably in a from 400 to 800 pM. Where it is used in combination with other metals it is preferably present in from 100 to 300 pM.

Where gallium, indium, thallium or antimony is used it is present in the solution to be stabilised preferably in not more than 700 pM particularly preferably in from 50 to 600 pM. Where it is used in combination with other metals it is preferably present in from 50 to 300 pM.

The total quantity of bismuth, gallium, germanium and tin in the 4-valent form in the solution to be stabilised is preferably from 350 to 1000 pM and particularly preferably from 400 to 850 pM. Smaller or greater total quantities appear to result in increased, sometimes greatly increased decomposition.

In all cases it is preferred that the added metal or metals be introduced as the oxide or hydrous oxide form.

Preferably the solution of permososulphuric acid also contains one or more acid organic phosphorus-containing compounds such as or di- or polyphosphonic acids or di- or polyphosphinic acids or water-soluble salts of any of the aforesaid, preferably the ammonium salt. A range of such compounds is available from the Monsanto Company under the Trade Name Dequest. A suitable such compound is 1-hydroxyethylidene 1,1-diphosphonic acid (Dequest 2010). The quantity of the phosphorus-containing compound is preferably from 0.01 to 1.0% particularly preferably from 0.1% to 0.4% by weight of the solution.

To achieve a maximum storage life the permonosulphuric acid solutions of the present invention are preferably made up using pure ingredients, particularly acid, hydrogen peroxide and water, having a low content of metallic impurities and of particles. Particularly preferably these materials are of electronic grade specification which fulfill the preferred, particularly preferred or optimal characteristics as to content of metallic impurities calculated as the metal, and of particles, set out in Tables 2 and 3 below:

TABLE 2

| Metal | Maximum concentration - μg/Kg by weight | | |
|---|---|---|---|
| | Preferred | Particularly preffered | Optimal |
| Cobalt | 100 | 50 | 10 |
| Chromium | 100 | 50 | 10 |
| Copper | 100 | 50 | 10 |
| Iron | 1000 | 500 | 100 |
| Manganese | 100 | 50 | 10 |
| Nickel | 100 | 50 | 10 |
| Zinc | 500 | 250 | 50 |

TABLE 3

| Particle size Microns | Particle concentration maxima (number ≧ given size in 10 ml) | |
|---|---|---|
| | Preferred | Particularly preffered |
| 0.5 | 2000 | 1500 |
| 1.0 | 500 | 300 |
| 2.0 | 120 | 70 |
| 5.0 | 16 | 10 |
| 10.0 | 4 | 2.5 |
| 15.0 | 1.7 | 1 |

Preferably the solutions of the present invention also contain one or more surfactants for example a perfluorinated surfactant such as the product available under the Trade Name Fluorad FC93 available from the 3M Company. A suitable quantity of the surfactant is from 20 to 500 parts per million by weight of the solution. The surfactant and the phosphorus-containing compounds referred to above may be included in the acid as taught in our copending patent application U.S. Ser. No. 361,144 filed June 5, 1989, entitled "Solutions of perhalogenated compounds".

The metals taught by the present invention may be included directly in a suitable quantity, obtained by dilution techniques, in the sulphuric acid making due allowance for any content of the same metals already present in the acid as shown by analysis.

The permonosulphuric acid solutions of the present invention may be utilised as photoresist stripping solutions by immersing therein a photoresist-bearing substrate for a suitable time, which may for example for about 10 seconds to about 15 minutes, removing the substrate and rinsing the substrate in 18 meg.ohm water. To avoid attack on desired metallisation on the substrate, the temperature of treatment is preferably maintained at below 50° C., particularly preferably below 40° C. and optionally at from 10° C. to below 30° C. as taught in European Patent Publication No. 0256284.

The invention will now be more specifically described by reference to the following Examples 1–15. The Examples comprise the preparation of formulations containing sulphuric acid and hydrogen peroxide, in standard quantities together, with a phosphonic acid and varying quantities of one or more added metals. The solutions were prepared by adding 5ml 86% by weight hydrogen peroxide slowly to 200ml 95% by weight sulphuric acid while controlling the temperature below 15° C. 0.2% by weight of the phosphonic acid (Dequest 2010) and the added metal had been previously dissolved in the sulphuric acid in the picomolal quantities (pM), calculated as the metal indicated hereafter.

The sulphuric acid and the hydrogen peroxide corresponded to the preferred electronic grade indicated above. The resulting solutions were subjected to an accelerated stability test involving heating at a temperature of 70° C. for 5 hours and a comparison in the content of available oxygen in the solution before and after such heating. The decrease in the available oxygen content is indicated as a percentage. A loss of no more than 10% under such conditions indicates a shelf storage life at a temperature of 20° C. or below of at least 3 months and usually of at least 9 months.

EXAMPLES 1-4 (EXAMPLE 2 IS A COMPARATIVE EXAMPLE)

The results of the accelerated stability tests for compositions in which a single metal according to the invention is used are summarised in FIGS. 1-4 attached hereto which show the picomolal quantity calculated as the metal plotted against the % decomposition obtained. In some instances the points represent the average of several test results.

FIG. 1 is a graph showing decomposition against varying quantities of bismuth (Example 1) added as $Bi_2O_3$.

Figure 2:
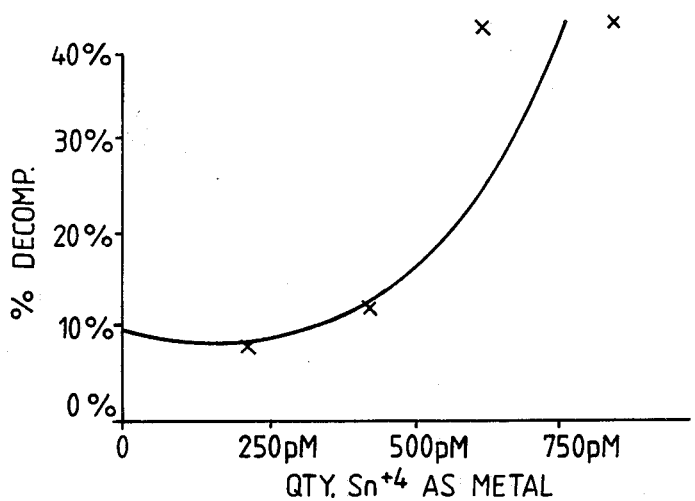
FIG. 2 is a graph showing decomposition of permonosulfuric acid solutions, stabilized with varying quantities of tin added as $SnO_2$ (Example 2).

FIG. 2 is a graph showing decomposition against varying quantities of tin added as $SnO_2$ (Example 2).

Figure 3:
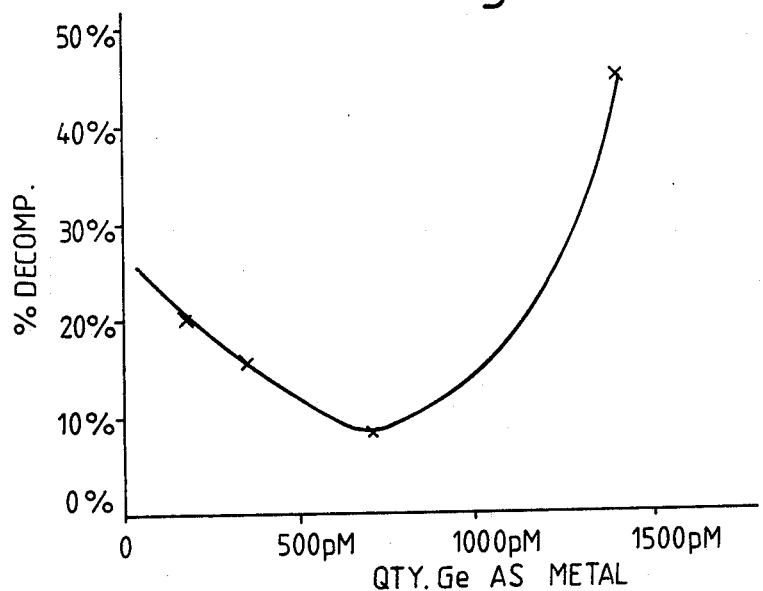
FIG. 3 is a graph showing decomposition of permonosulfuric acid solutions, stabilized with varying quantities of germanium (Example 3) added as GeO.

FIG. 3 is a graph showing decomposition against varying quantities of germanium (Example 3) added as GeO.

Figure 4:
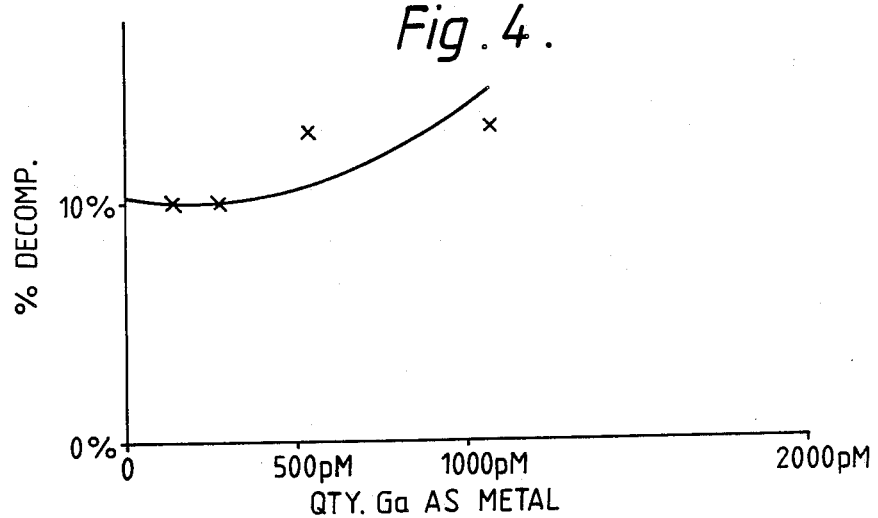
FIG. 4 is a graph showing decomposition of permonosulfuric acid solutions, stabilized with varying quantities of gallium (Example 4) added as $Ga_2O_3$.

FIG. 4 is a graph showing decomposition against varying quantities of gallium (Example 4) added as $Ga_2O_3$.

It is seen from the graphs that there is an optimum quantity of metal, at which decomposition is least, which quantity is different for each metal.

EXAMPLES 5-6

The solution contained different sources and quantities of tin. Ex 5. 610 pM Sn added as $Na_2SnO_3$—10% decomposition Ex 6. 210 pM Sn added as $SnO_2$—7.6% decomposition

EXAMPLES 7-10

The solutions contained mixtures of some or all of $Bi_2O_3$, $SnO_2$, GeO and $Ga_2O_3$. The quantities of oxides and the % decomposition obtained is summarised in Table 4.

TABLE 4

| pM | Ex 7 | Ex 8 | Ex 9 | Ex 10 |
|---|---|---|---|---|
| Bi | 70 | 70 | 70 | — |
| Ga | 260 | — | 130 | 130 |
| Ge | 170 | 170 | — | 170 |
| Sn | 100 | 210 | 210 | 210 |
| Total | 600 | 450 | 410 | 510 |
| Decomp. | 3% | 4% | 6% | 12.5% |

EXAMPLES 11-14

The solutions contained larger than optimum total quantities of one or more of the metal oxides or hydrous oxides. The quantities of oxides and the % decomposition obtained is summarised in Table 5.

TABLE 5

| pM | Ex 11 | Ex 12 | Ex 13 | Ex 14 |
|---|---|---|---|---|
| Bi | 290 | — | 140 | 590 |
| Ga | 130 | 720 | 130 | 130 |
| Ge | 170 | — | 340 | 340 |
| Sn | 210 | 840 | 210 | 420 |
| Total | 800 | 1560 | 820 | 1480 |
| Decomp. | 12% | 12.3% | 9% | 15% |

EXAMPLE 15

The solutions contained smaller than optimum total quantities of the metal oxides or hydrous oxides. The quantities of metal and the % decomposition obtained is summarised in Table 6.

TABLE 6

| pM | Ex 15 |
|---|---|
| Bi | 70 |
| Ga | 130 |
| Ge | — |
| Sn | 100 |
| Total | 300 |
| Decomp. | 48% |

We claim:

1. A stabilised aqueous mixed permonosulphuric acid and sulphuric acid solution containing a organic 5-valent phosphorus compound sequestrant and a stabilizing quantity of an added metal compound stabilizer, said added metal compound being selected from the group consisting of gallium, germanium, indium, antimony, thallium, bismuth, lead and mixtures thereof.

2. A solution as claimed in claim 1 containing bismuth in a quantity of 500 to 2500 picomoles per kg or germanium in a quantity of 400 to 1000 picomoles per kg or gallium, indium, thallium or antimony in from 50 to 700 picomoles per kg.

3. A solution as claimed in claim 1 wherein the added metal is added in the form of the oxide or hydrous oxide.

4. A solution as claimed in claim 3 wherein the sequestrant is 1-hydroxy ethylidene 1,1-diphosphonic acid.

5. A solution as claimed in claim 1 wherein the quantity of the sequestrant is from 0.0% to 1.0% by weight of the solution.

6. A solution as claimed in claim 1 containing at least 2% by weight of permonosulphuric acid.

7. A solution as claimed in claim 1 additionally containing tin in the 4-valent form.

8. A solution as claimed in claim 7 wherein the added metal is selected from more than one of gallium, germanium, indium, lead and bismuth.

9. A solution as claimed in claim 7 wherein the added metal includes bismuth.

10. A solution as claimed in claim 7 wherein the added metal includes comprises a combination of bismuth, gallium and germanium.

11. A solution as claimed in claim 7 wherein the solution includes tin in the 4-valent form in a quantity of from 50 to 250 picomoles per kg and one more of or bismuth in a quantity of from 100 to 300 picomoles per kg or gallium, indium, thallium or antimony in from 50 to 300 picomoles per kg.

12. A solution as claimed in claim 7 wherein solution includes a combination of bismuth, gallium, germanium and tin in the 4-valent form in a total quantity of 350 to 1000 picomoles per kg.

* * * * *